United States Patent
Fargeau et al.

(10) Patent No.: US 8,292,628 B2
(45) Date of Patent: Oct. 23, 2012

(54) AUDIO/VIDEO ELECTRONIC APPLIANCE, IN PARTICULAR A CAR RADIO, HAVING A REMOVABLE FRONT PLATE

(75) Inventors: Karim Fargeau, Charenton le Pont (FR); David Tea, Lognes (FR); Bertrand Vignau-Lous, Paris (FR)

(73) Assignee: Parrot, Paris (FR)

( * ) Notice: Subject to any disclaimer, the term of this patent is extended or adjusted under 35 U.S.C. 154(b) by 585 days.

(21) Appl. No.: 12/577,040

(22) Filed: Oct. 9, 2009

(65) Prior Publication Data
US 2010/0109493 A1   May 6, 2010

(30) Foreign Application Priority Data
Nov. 6, 2008 (FR) ...................... 08 06198

(51) Int. Cl.
*H01R 13/62* (2006.01)
(52) U.S. Cl. ...................... 439/39; 340/426.1
(58) Field of Classification Search ............ 439/39, 439/34; 340/426.1; 307/10.2, 10.1
See application file for complete search history.

(56) References Cited

U.S. PATENT DOCUMENTS

| | | | | |
|---|---|---|---|---|
| 5,637,928 A | * | 6/1997 | Nakajima et al. | 307/10.2 |
| 7,315,260 B1 | * | 1/2008 | Lam et al. | 341/22 |
| 7,396,235 B2 | * | 7/2008 | De Wilde et al. | 439/39 |
| 2009/0246979 A1 | * | 10/2009 | Rodrigues | 439/39 |

FOREIGN PATENT DOCUMENTS

| | | |
|---|---|---|
| DE | 4000425 A1 | 10/1990 |
| DE | 202004000235 UI | 5/2004 |
| EP | 0899889 A2 | 3/1999 |
| EP | 1283132 A2 | 12/2003 |

* cited by examiner

*Primary Examiner* — Gary F. Paumen
(74) *Attorney, Agent, or Firm* — Haverstock & Owens LLP

(57) ABSTRACT

The appliance comprises a casing, a removable front plate, an electrical connector, and mechanical means for assembling the front plate on the casing and for fastening it thereto. The mechanical means comprise, at a first end, means that form a separable hinge comprising at least one pair of respective magnetic elements such as permanent magnets disposed in the region of the connector and facing one another on the casing and the front plate, and the opposite end, means for locking the front plate to the casing. Mechanical coupling of the front plate on the casing at the location of the separable magnetic hinge results solely from the mutual attraction of the facing magnetic elements.

10 Claims, 2 Drawing Sheets

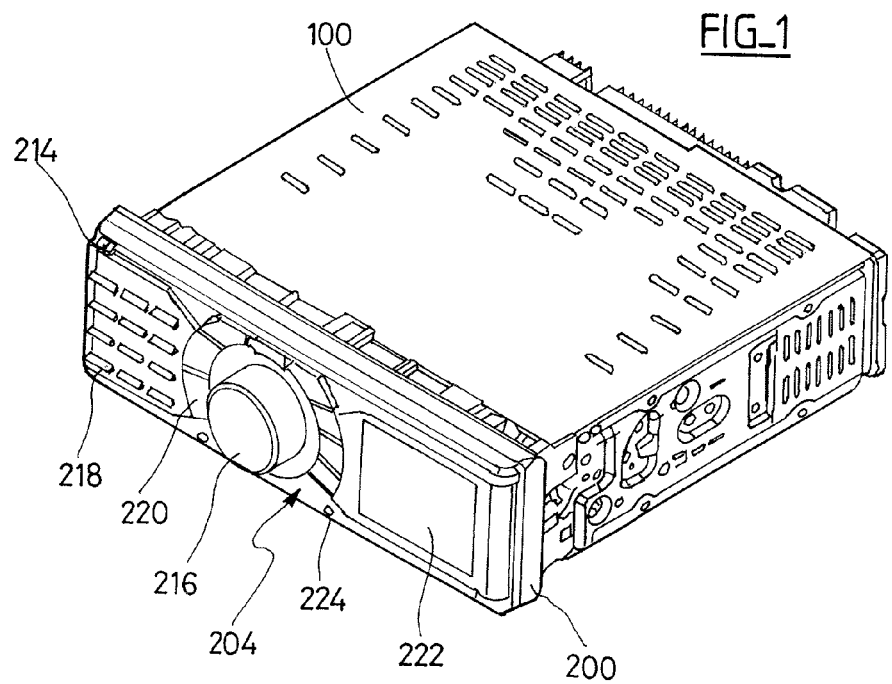
FIG_1
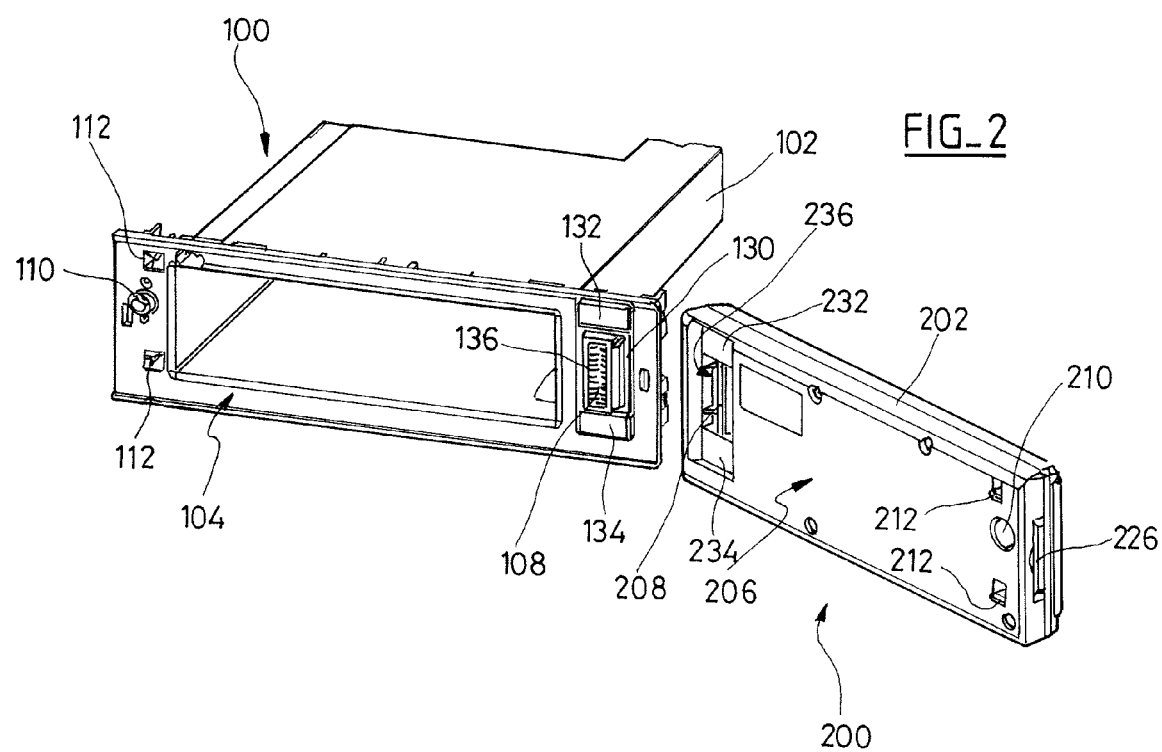
FIG_2

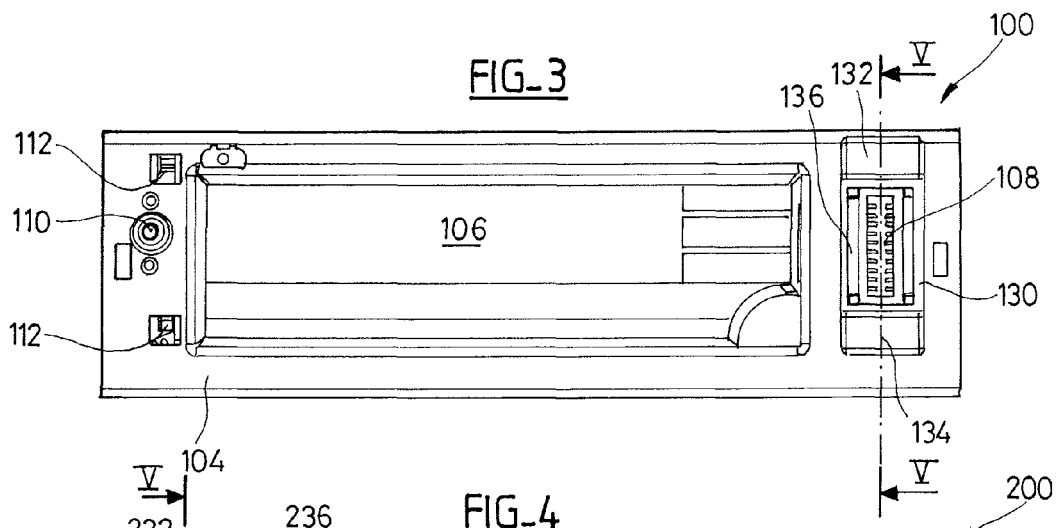
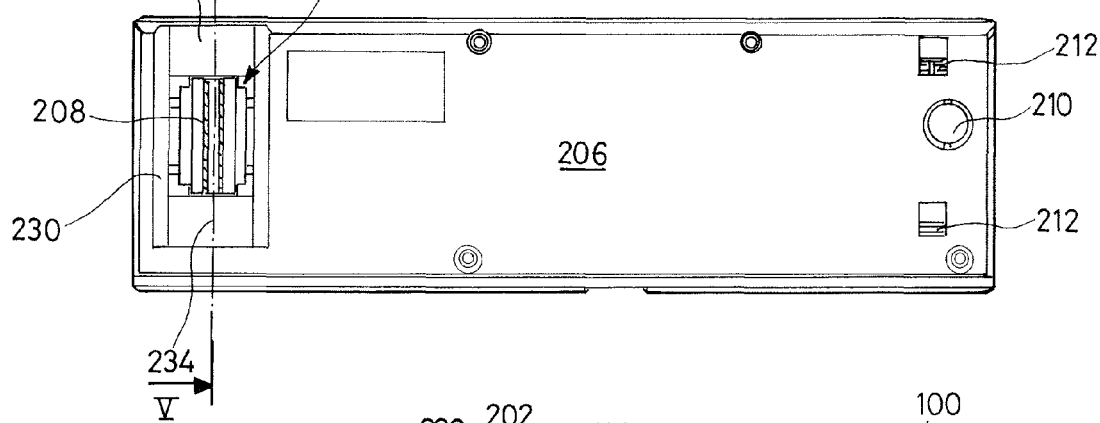
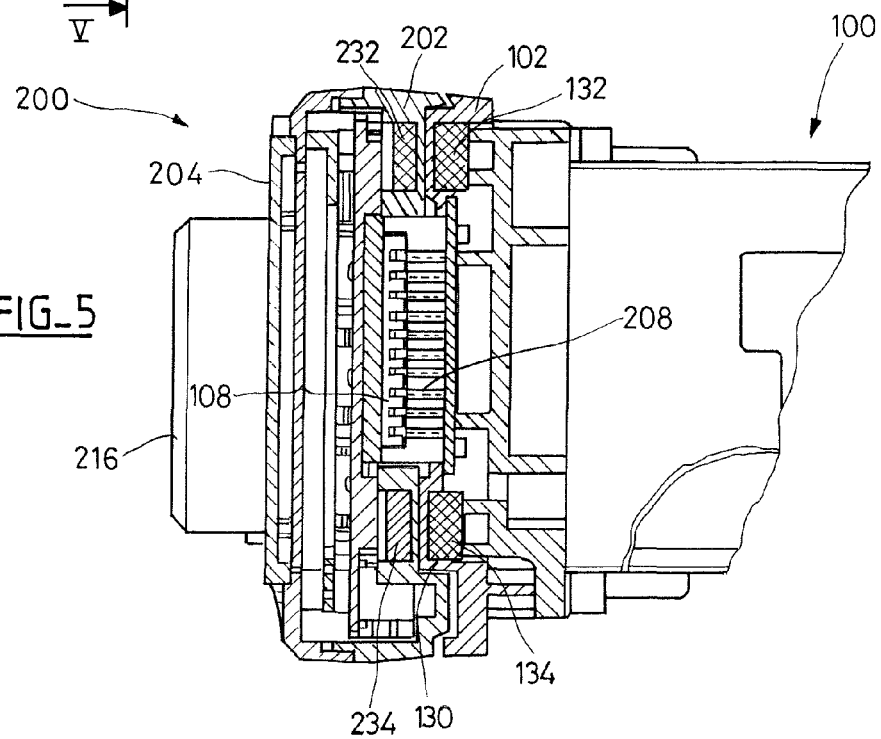

AUDIO/VIDEO ELECTRONIC APPLIANCE, IN PARTICULAR A CAR RADIO, HAVING A REMOVABLE FRONT PLATE

BACKGROUND OF THE INVENTION

The invention relates to audio/video electronic appliances that comprise a casing provided with an element, such as a front plate, that is removably mounted on the casing.

The invention applies more particularly to car radios, in which the casing is permanently incorporated in the dashboard of the motor vehicle, with a removable anti-theft front plate that includes in particular various control buttons, displays, etc. The front plate may also serve to uncover a slot for inserting a compact disk (CD).

Nevertheless, although the application to car radios is particularly advantageous, the invention is not limited thereto and it will be understood that the invention can be applied to numerous other types of electronic appliance.

FIELD OF THE INVENTION

A car radio including a removable front plate is described for example in FR 2 890 513 A1 (Parrot).

The casing and the front plate house various respective electronic circuits, each possessing a connector element serving to connect the circuits together when the front plate is pressed against the casing, thereby making the car radio operational. Mechanical means also serve in this position to provide locking between the front plate and the casing.

Another example of a car radio with a removable front plate is the RK 8200 model sold by Parrot SA, Paris, France, which appliance is described in particular in French application 07 06347 filed Sep. 11, 2007 for "Appareil audio pour véhicule avec un logement pour appareils électroniques portables" [Audio appliance for a vehicle including a housing for portable electronic appliances], published under the reference FR 2 920 945 A1 on Mar. 13, 2009. The detachable front plate of that appliance hides a hatch in which it is possible to place a mobile telephone suitable for coupling to the car radio over a wireless connection of the Bluetooth (trademark filed by Bluetooth SIG, Inc.) type, or indeed an MP3 player that is coupled to the car radio by a plug connection located at the bottom of the hatch.

The front plate contains most of the electronic circuits needed for controlling the appliance other with the high frequency circuits of an frequency modulation (FM) radio tuner and the Bluetooth interface, together with various buttons and control keys, a display screen, a memory card reader, microphones for enabling "hands-free" operation of the telephone, etc. The casing contains power supply circuits connected to the power supply circuits on board the vehicle, the audio power amplifier, and various connector elements.

In that appliance, the front plate is put into place by being pressed against the open front face of the casing, and then by being locked thereto by click-fastening using a system of hooks and catches that is suitable for being released by pressing on a button placed on the side of the front plate.

Nevertheless, putting the front plate into place on the casing requires a certain amount of dexterity on the part of the user, even though, depending on the location where the car radio is placed in the dashboard, manipulation conditions are not always ideal. In addition, since the appliance includes a hatch for receiving an MP3 player or a mobile telephone, occasions on which the front plate is put into place and removed are rather frequent, much more so than with a mere anti-theft front plate.

Furthermore, it is important to position the front plate properly when it is put into place so that the two complementary elements of the electrical connector between the front plate and the casing can couple together properly.

Finally, such a system needs to be sufficiently robust to be capable of remaining unaffected by wrong moves and inaccurate positioning.

In order to provide more convenient access to the internal hatch of a car radio suitable for housing a mobile telephone, FR 2 768 975 A1 provides a pivoting front plate that is hinged to the casing like a flap. At one of its ends, the front plate is provided with a (non-separable) hinge that is hinged to the casing, and at its opposite end (distal end) it is provided with a latch for preventing any unwanted opening of the flap constituted by the front plate. That latch may be mechanical or else magnetic, with co-operating magnets placed on the distal end of the pivotable front plate and on the facing portion of the casing.

That system presents the drawback of the front plate not being removable, so it cannot act as an anti-theft device. Nor is it capable of being used, like the above-mentioned RK 8200 appliance described in application FR 2 920 945 A1, as a peripheral suitable for connection to a computer, e.g. in order to download a piece of music from the computer for playing back subsequently on the car radio.

In any event, even if the hinge were adapted to be separable, considerable weakness would remain in the hinge. Furthermore, an additional problem would arise, namely that of establishing a releasable electrical connection between the casing and the front plate: so long as the front plate is not separable from the casing, such a connection can be provided simply by means of a ribbon cable without any intermediate connector; in contrast, if it is desired to be able to remove it completely, it becomes necessary to provide means for coupling and decoupling the circuits in the casing relative to the circuits in the front plate.

For that purpose, EP 1 283 132 A2 proposes a wireless, i.e. non-metallic coupling, e.g. a coupling that is electromagnetic (radio frequency (RF) coupling), or optical (infrared coupling). That technique presents the advantage of greater complexity for the circuits in the casing and in the front plate as a result of the necessary interfaces, and it also presents the drawback of occupying an area that would otherwise be available in the central space of the casing, because of the need for transducers to be present (RF loop, etc.).

That drawback would not be a problem if the central space were merely occupied by a slot for inserting a CD, however it is much more problematic when it is desired, as in the above-mentioned RK 8200 appliance described in application FR 2 920 945 A1, to use the central space to provide a hatch giving access to a housing suitable for enclosing a mobile telephone or an MP3 player inside the car radio casing, since the surface area occupied by the transducer correspondingly reduces the dimensions of the hatch.

OBJECT AND SUMMARY OF THE INVENTION

On the contrary, the invention seeks to provide an appliance in which the casing and the front plate are coupled together via a metallic connection by means of an electrical connector.

The difficulty then consists in providing coupling that is both easy and reliable when mounting the front plate on the casing, and also capable of maintaining said coupling under all circumstances, in particular in spite of the vibration, impacts, shaking, etc. that the appliance is likely to encounter in a car environment.

To mitigate that difficulty, as well as avoiding the drawbacks set out above, the invention essentially proposes hinging the front plate to the casing via one of its lateral ends by means of a "magnetic hinge" made up of respective magnetic elements disposed facing one another on the front plate and on the casing, together with a latch situated at the end of the front plate opposite from its end carrying the magnetic hinge, and with the connector being disposed close to the magnetic element.

The advantages that result from this configuration are numerous:

the front plate is easy to mount on the casing, without any risk of wrong moves;

once the front plate has been mounted, the maximum retention force (exerted by the united magnetic elements) in the vicinity of the connector avoids any risk of untimely interruption, and even if accidental separation should occur, there is an automatic return to the coupled position;

while the front plate is being separated, the force that needs to be exerted to separate the magnetic elements and to decouple the connector is small, by virtue of the lever arm effect; and a large area is released in the central portion of the casing since the mechanical elements (hinge and connector one side, latch on the other) are situated only in the lateral end regions of the casing.

In this respect, it can be observed that orienting the connector in the vertical direction, an orientation that is unusual in traditional configurations, arises as a result of the vertical disposition of the axis of the magnetic hinge, thereby contributing to minimizing the space occupied in the central portion of the casing.

More precisely, the present invention proposes an audio/video electronic appliance of the general type described in above-mentioned EP 1 283 132 A2, i.e. comprising: a casing, in particular a casing suitable for incorporation in a motor vehicle dashboard, and housing a first set of electronic circuits; a front plate removably mounted on the casing, the front plate housing a second set of electronic circuits connected to a plurality of control and monitoring members that are visible on the front plate; and mechanical means suitable for enabling the front plate to be assembled on the casing and to be fastened thereto.

In a manner characteristic of the invention, the mechanical means for assembling the front plate on the casing and fastening it thereto comprise: at a first lateral end of the front plate and of the casing, means forming a separable hinge, comprising at least one pair of respective magnetic elements placed facing one another on the casing and the front plate; and at an opposite, second lateral end, means for locking the front plate to the casing. The appliance further includes an electrical connector comprising co-operating members on the casing and on the front plate, for connecting together said first and second sets of electric circuits so as to make the electronic appliance functional when the front plate is mounted on the casing. The electrical connector is disposed close to said at least one pair of magnetic elements of the means forming a separable hinge.

According to various subsidiary characteristics that are advantageous:

the magnetic elements are permanent magnets placed facing one another on the casing and the front plate;

the means forming the separable hinge are essentially lacking in any mechanical part for connecting the front plate to the casing, the mechanical coupling between the front plate and the casing at this location resulting solely from the mutual attraction of the facing magnetic elements;

the means forming a separable hinge comprise two pairs of magnetic elements disposed on either side of the electrical connector. Under such circumstances, the two pairs of magnetic elements are dimensioned and located in such a manner as to define between them a domain in which the electrical connector is completely circumscribed, and extending in a direction perpendicular to the long direction of the front plate, said dimension defining a pivot axis for the means forming a separable hinge;

the electrical connector includes a projection formed on the casing, in particular a peripheral projection of the electrical connector that is suitable for engaging in a complementary recessed shape formed in the front plate, or vice versa;

the means for locking the front plate to the casing comprise a magnetic latch closure and/or a magnetic or electromagnetic closure; and there are also provided at said lateral end guide means comprising a projection formed on the casing and engageable in a complementary recessed shape formed in the front plate, or vice versa.

BRIEF DESCRIPTION OF THE DRAWINGS

There follows a description of an embodiment of the device of the invention given with reference to the accompanying drawings in which the same numerical references are used from one figure to another to designate elements that are identical or functionally similar.

FIG. 1 is a general perspective view of an appliance of the invention, applied to providing a car radio with a removable front plate mounted on a casing.

FIG. 2 is a perspective view showing the front plate and the casing in a dissociated position, revealing the various respective electrical and mechanical coupling elements.

FIG. 3 is an elevation view from the front of the car radio casing of FIGS. 1 and 2.

FIG. 4 is an elevation view from behind shown the front plate of the car radio of FIGS. 1 and 2.

FIG. 5 is a fragmentary side elevation view of the car radio in section on V-V in FIGS. 3 and 4, in a configuration with the front plate mounted on the casing.

MORE DETAILED DESCRIPTION

The car radio of the invention is in the form of an assembly of standardized dimensions suitable for incorporating in the dashboard of a motor vehicle, and it is constituted by a casing 100 and a removable front plate 200.

As shown more precisely in FIGS. 2 and 3, the casing 100 comprises a body 102 with a front face 104 that opens to an internal housing or hatch 106, e.g. for the purpose of receiving a mobile telephone or an MP3 player. The casing 100 also includes, on its front face 104, a connector element 108 situated on one side of the hatch 106 (to the right in the figure), while on the opposite side (to the left) it has a portion in relief 110 for guiding the front plate during closure, together with locking means, e.g. in the form of hooks 112.

The removable front plate 200, as shown more precisely in FIGS. 2 and 4, is in the form of a thin rectangular slab 202 having a front face 204 that faces the user and a rear face 206 for pressing against the front face 104 of the casing 100. The rear face 206 includes a connector element 208 complementary to the connector element 108 of the casing and placed in register therewith, so as to enable them to be mutually engaged and coupled together when the front plate is pressed against the casing. The rear face 206 also includes a guide recess 210 complementary to the portion in relief 110 on the casing, together with locking means 212, e.g. in the form of hooks that can be snap-fastened and locked onto the hooks 112 of the casing 100 that are situated facing them, these elements being suitable for being uncoupled by pressing on a button 214 (FIG. 1) placed at the end of the front plate. On its visible front face 204, the front plate 200 has a certain number of members for control, monitoring, and input/output purposes, such as: a rotary knob 216, a keypad 218, keys 220 for controlling a telephone or an MP3 player, a display screen 222, microphones 224, and a memory card reader 226 (FIG. 2).

In a manner characteristic of the invention, the removable front plate 200 is mounted and hinged on the casing by means of a "magnetic hinge" system making use of pairs of magnets 132 & 232 or 134 & 234 that are mounted respectively on the front face 104 of the casing 100 and on the rear face 206 of the front plate 200.

The magnets used are of a type that provide sufficient attraction even when they are spaced apart by a few millimeters, e.g. neodymium magnets that provide a very high force of attraction even when very small in size.

These magnets are advantageously mounted in the immediate vicinity of the connector 108, 208, e.g. on a support 130, 230 surrounding the connector. In the configuration shown, two magnets 132 and 134 are provided on the casing (and in like manner two magnets 232 and 234 are provided on the front plate), which magnets are located above and below the connector 108 (or above and below the connector 208 for the front plate). This configuration defines a vertical axis for the "magnetic hinge", thus enabling the movable front plate to be hinged on the casing by pivoting about this axis. The two pairs of magnets thus act as two hinge points between the casing and the front plate, without it being necessary to add any mechanical connection part, with the mechanical coupling between the front plate and the casing at this location (proximal side of the hinge) resulting solely from the mutual attraction between the pairs of facing magnets.

The front plate is put into place on the casing very simply by bringing these two elements close together in the region of the connector 108, 208: the mutual attraction between the magnets 132 & 232 and 134 & 234 serves to ensure immediate mechanical coupling of the front plate on the casing, and simultaneously to establish electrical connection as a result of the two connector elements 108 and 208 being mutually engaged. This operation can be made easier by giving the facing portions of the connector a suitable shape, e.g. a projecting shape 136 for the connector 108 of the casing that is complementary to a recessed shape 236 for the connector 208 of the front plate: such a male/female configuration serves not only to providing keying, but also to provide accurate guidance of the two elements when the mutual attraction between the magnets causes the front plate to move towards the casing in the region of the connector, thereby ensuring that any wrong move or inaccurate positioning is avoided.

Once the "magnetic hinge" has been formed in this way, it suffices for the user to press the opposite end of the front plate (distal side of the hinge) against the front face 104 of the casing 100 until the respective hooks 112, 212 snap together with guidance being provided by the portion in relief 110 being inserted into the recess 210. Coupling between the front plate 100 and the casing 200 is thus well established, both mechanically and electrically.

In a variant, the purely mechanical closure system using hooks 112 and 212 could be replaced by a magnetic latch system (completely independent of the magnets 132, 134, 232, 234 of the magnetic hinge), or indeed closure by an electromagnet that is releasable by an electrical command.

In yet another variant, the pair of complementary magnets may be replaced by a magnet that is merely associated with a passive ferromagnetic element, e.g. a plate of soft iron replacing the magnets 232 and 234 of the front plate.

What is claimed is:

1. An audio/video electronic appliance, in particular a car radio, the appliance comprising:
   a casing, in particular a casing suitable for incorporation in a motor vehicle dashboard, and housing a first set of electronic circuits;
   a front plate removably mounted on the casing, the front plate housing a second set of electronic circuits connected to a plurality of control and monitoring members that are visible on the front plate; and
   mechanical means suitable for enabling the front plate to be assembled on the casing and to be fastened thereto;
   wherein:
   the mechanical means for assembling the front plate on the casing and fastening it thereto comprise:
      at a first lateral end of the front plate and of the casing, means forming a separable hinge, comprising at least one pair of respective magnetic elements placed facing one another on the casing and the front plate; and
      at an opposite, second lateral end, means for locking the front plate to the casing;
   the appliance further includes an electrical connector comprising co-operating members on the casing and on the front plate, for connecting together said first and second sets of electric circuits so as to make the electronic appliance functional when the front plate is mounted on the casing; and
   the electrical connector is disposed close to said at least one pair of magnetic elements of the means forming a separable hinge.

2. The appliance of claim 1, wherein said pair of magnetic elements comprises permanent magnets placed facing one another on the casing and the front plate.

3. The appliance of claim 1, wherein the means forming the separable hinge are essentially lacking in any mechanical part for connecting the front plate to the casing, the mechanical coupling between the front plate and the casing at this location resulting solely from the mutual attraction of the facing magnetic elements.

4. The appliance of claim 1, wherein the means forming a separable hinge comprise two pairs of magnetic elements disposed on either side of the electrical connector.

5. The appliance of claim 4, wherein the two pairs of magnetic elements are dimensioned and located in such a manner as to define between them a domain in which the electrical connector is completely circumscribed.

6. The appliance of claim 4, wherein the two pairs of magnetic elements are disposed on either side of the electrical connector in a direction perpendicular to the long dimension of the front plate, said dimension defining a pivot axis for the means forming a separable hinge.

7. The appliance of claim 1, wherein the electrical connector includes a projection formed on the casing and suitable for engaging in a complementary recessed shape formed in the front plate or vice versa.

8. The appliance of claim 7, wherein the projection is a peripheral projection of the electrical connector.

9. The appliance of claim 1, wherein the means for locking the front plate to the casing comprise a magnetic latch closure and/or a magnetic or electromagnetic closure.

10. The appliance of claim 1, wherein there are also provided at said lateral end guide means comprising a projection formed on the casing and engageable in a complementary recessed shape formed in the front plate, or vice versa.

* * * * *